United States Patent [19]

Chiou

[11] Patent Number: 5,523,918
[45] Date of Patent: Jun. 4, 1996

[54] CPU HEAT DISSIPATING APPARATUS

[76] Inventor: Ming D. Chiou, 3F., No. 4, Alley 11, Lane 327, Sec. 2, Chung Shan Rd., Chung Ho City, Taipei, Taiwan

[21] Appl. No.: 513,523

[22] Filed: Aug. 10, 1995

[51] Int. Cl.$^6$ ..................................................... H05K 7/20
[52] U.S. Cl. ........................................... 361/695; 361/760
[58] Field of Search ........................... 361/688, 694–697, 361/704, 706–707, 710–711, 715–716, 745, 751, 760

[56] References Cited

U.S. PATENT DOCUMENTS

| | | | |
|---|---|---|---|
| 4,513,812 | 4/1985 | Papst et al. | 361/697 |
| 4,931,904 | 6/1990 | Yiu | 361/695 |
| 5,079,438 | 1/1992 | Heung | 361/695 |

Primary Examiner—Gregory D. Thompson
Attorney, Agent, or Firm—Bacon & Thomas

[57] ABSTRACT

A CPU heat dissipating apparatus including a metal PC board, a heat sink welded to the metal PC board, and a fan installed in the metal PC board and disposed within a circular center opening on the heat sink wherein the metal PC board has a plurality of radial welding points, and a printed circuit, the printed circuit including a fail-safe circuit for the protection of the fan. The heat sink has a plurality of radial flanges radially and alternatively spaced around its circular center opening at two different elevations and welded to the welding points of the metal PC board, and a plurality of holes and notches on the radial flanges for passing the electronic components and conductors of the printed circuit to separate them from contact with one another.

2 Claims, 4 Drawing Sheets

CPU HEAT DISSIPATING APPARATUS

BACKGROUND OF THE INVENTION

The present invention relates to a CPU heat dissipating apparatus for installation in a CPU to carry heat away from it, which comprises a metal PC board, a heat sink welded to the metal PC board, and a fan installed in the metal PC board within a circular opening on the heat sink.

The CPU of a computer system is the operation center, which release heat during its operation. Heat dissipating means is needed to carry heat away from the CPU during the operation of the computer system so that the operation of the CPU can be maintained normal, and the service life of the CPU can be prolonged. Regular heat dissipating means for this purpose generally comprise an aluminum mounting plate for fastening to the CPU, a heat sink and a fan and a fan drive-circuit respectively installed in the aluminum mounting plate. Because the substrate of the fan drive circuit is mounted on the aluminum mounting plate, much vertical installation space is required. If this structure of heat dissipating apparatus is used in a portable computer, it is difficult to spare a space in the portable computer for the installation of the heat dissipating apparatus. Furthermore, it is also difficult to install a fail-safe circuit in the heat dissipating apparatus for the protection of the fan.

SUMMARY OF THE INVENTION

The present invention has been accomplished to provide a CPU heat dissipating apparatus which eliminates the aforesaid drawbacks. It is one object of the present invention to provide a CPU heat dissipating apparatus which needs less installation space. It is another object of the present invention to provide a CPU heat dissipating apparatus which is inexpensive to manufacture. It is still another object of the present invention to provide a CPU heat dissipating apparatus which is suitable for use in small portable computers.

According to one aspect of the present invention, the CPU heat dissipating apparatus comprises a metal PC board, a fan, and a heat sink, wherein the heat sink has a circular center opening and a plurality of radial flanges alternatively spaced around the circular center opening at two different elevations; the metal PC board has a plurality of radial welding points to which the radial flanges of lower elevation are welded, and a printed circuit, which comprises a fail-safe circuit for the protection of the fan.

According to another aspect of the present invention, the heat sink comprises a plurality of holes and notches on the radial flanges for passing the electronic components and conductors of the printed circuit, therefore the electronic components and conductors of the printed circuit are separated from one another.

According to still another aspect of the present invention, the metal PC board has an upright center post for mounting the fan, permitting the fan to be disposed within the annular center opening of the heat sink.

BRIEF DESCRIPTION OF THE DRAWINGS

FIG. 2a is an exploded view of the CPU heat dissipating apparatus shown in FIG. 1;

FIG. 2b is an enlarged view of Part "b" of FIG. 2a;

DETAILED DESCRIPTION OF THE PREFERRED EMBODIMENTS

Figure 1:
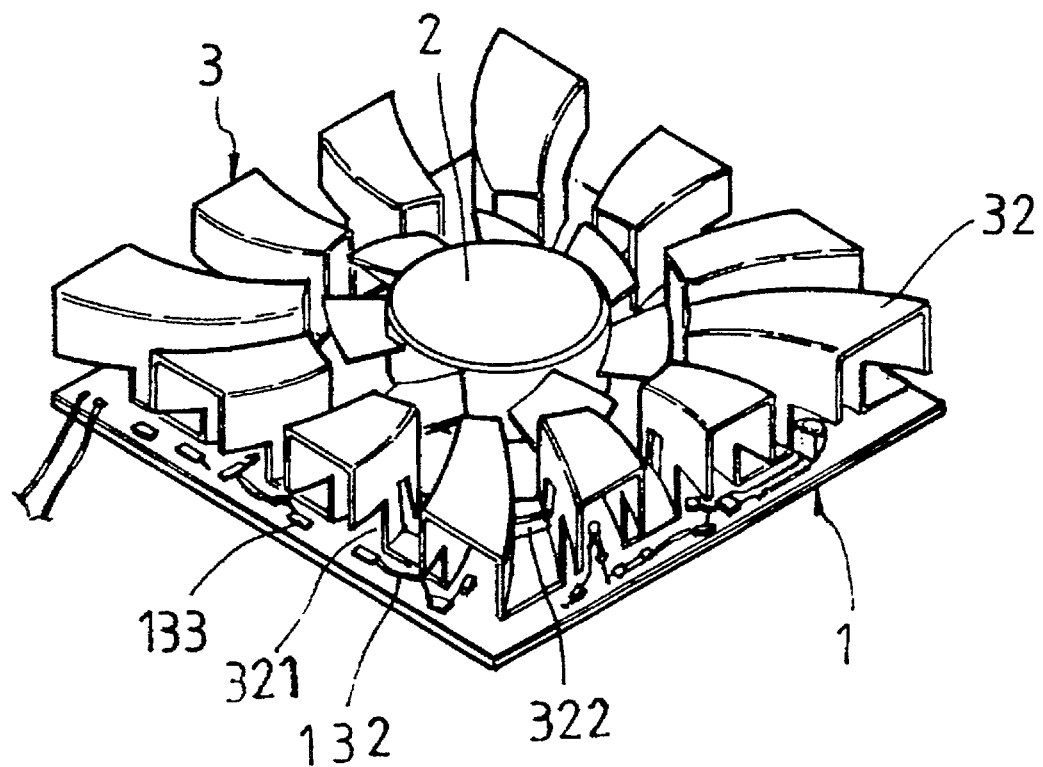
FIG. 1 is an elevational view of a CPU heat dissipating apparatus according to the present invention.
Figures 2A, 2B:
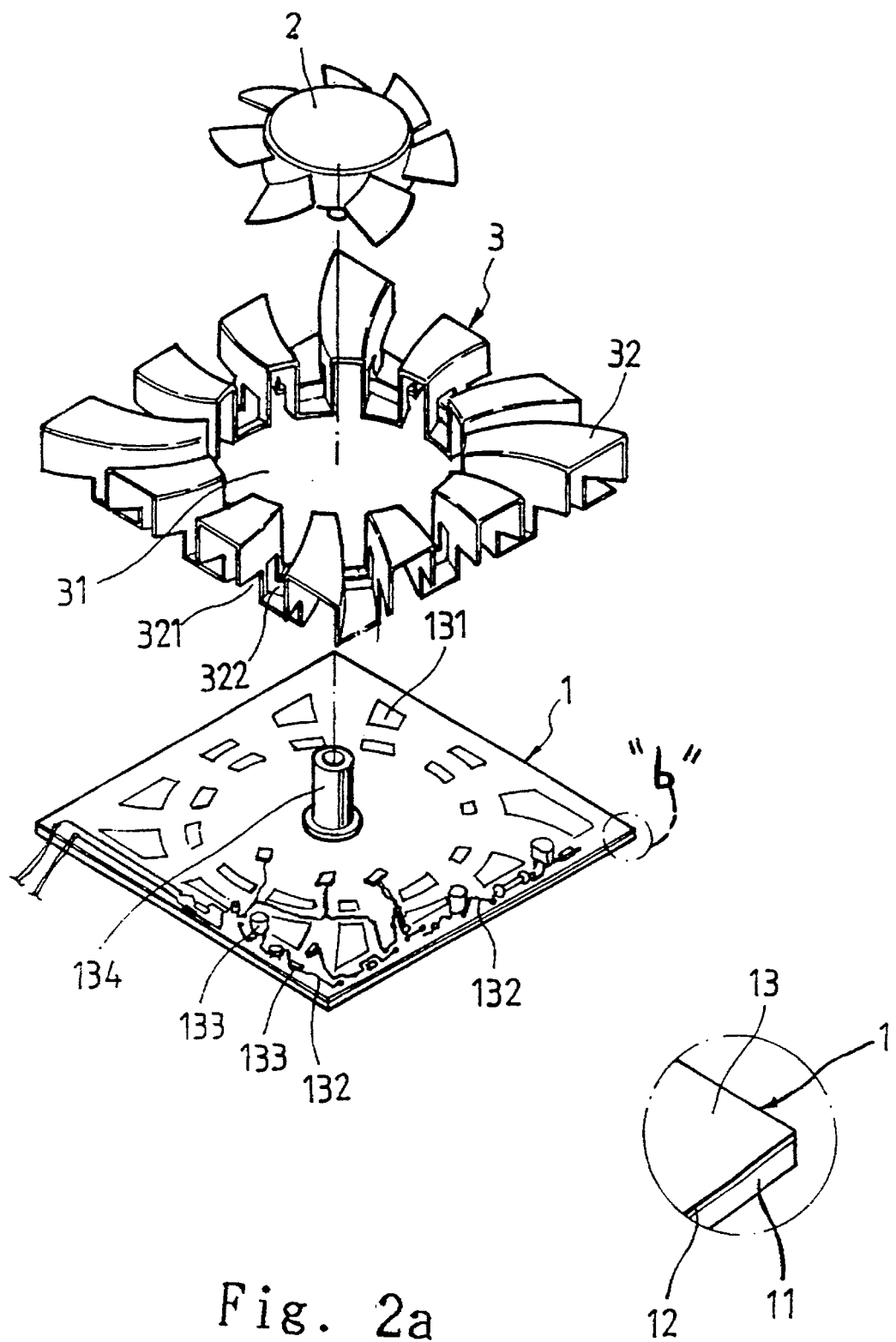

Referring to FIGS. 1, 2a and 2b, a CPU heat dissipating apparatus in accordance with the present invention is generally comprised of a metal PC board 1, a fan 2, and a heat sink 3. The metal PC board 1 is comprised of a flat aluminum bottom plate 11, a thin bakelite intermediate plate 12, and a copper foil top layer 13. The copper foil top layer 13 is processed into a printed circuit 132 and a plurality of welding points 131 at the electric circuit 132 by etching. The electronic components 133 of the fan drive circuit, which controls the operation of the fan 2, are welded to the printed circuit 132. The heat sink 3 comprises a circular center opening 31, and radial flanges 32 radially and alternatively spaced around the circular center opening 31 at two different elevations, each radial flange 32 having a plurality of notches 321 and holes 322. The radial flanges 32 of lower elevation are welded to the welding points 131 of the metal PC board 1. Because the heat sink 3 has notches 321 and holes 322 on the radial flanges 32, the copper foil conductors and electronic components of the printed circuit 132 are properly separated from one another. The metal PC board 1 further comprises an upright center shaft 134 for mounting the fan 2. When the CPU heat dissipating apparatus is assembled, the fan 2 is mounted on the upright center shaft 134 within the circular center opening 31 of the heat sink 3. When the CPU heat dissipating apparatus is installed in the CPU, heat from the CPU is quickly carried away by means of the flat aluminum bottom plate 11, the heat sink 3, and the fan 2. The printed circuit 132 of the metal PC board 1 comprises a fail-safe circuit (not shown) which protects the fan 2.

Figure 3:
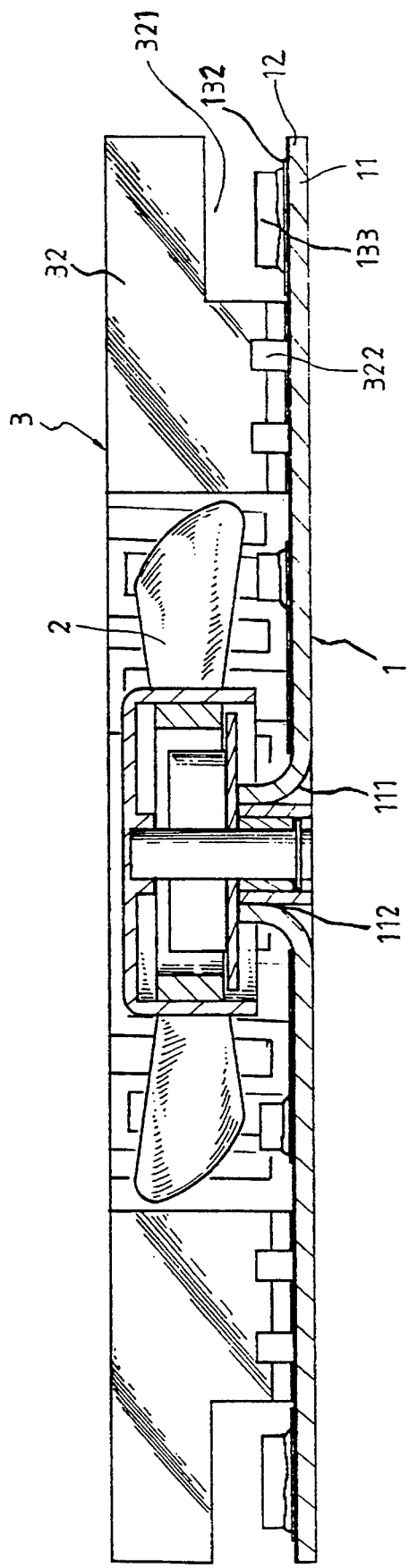
FIG. 3 is a side view in section in an enlarged scale of the CPU heat dissipating apparatus shown in FIG. 1.

Referring to FIG. 3, the electronic components 133 are disposed in the notches 321 of the radial flanges 32 of the heat sink 3, and the conductors of the printed circuit 132 pass through the holes 322 of the radial flanges 32. Therefore, the electronic components 133 and the conductors of the printed circuit 132 are separated from one another. Furthermore, an annular coupling portion 1122 may be made at the center 111 of the aluminum bottom plate 11 for coupling the fan 2, permitting the fan 2 to be installed in the metal PC board 1 and disposed inside the circular center opening 31 of the heat sink 3.

Figure 4:
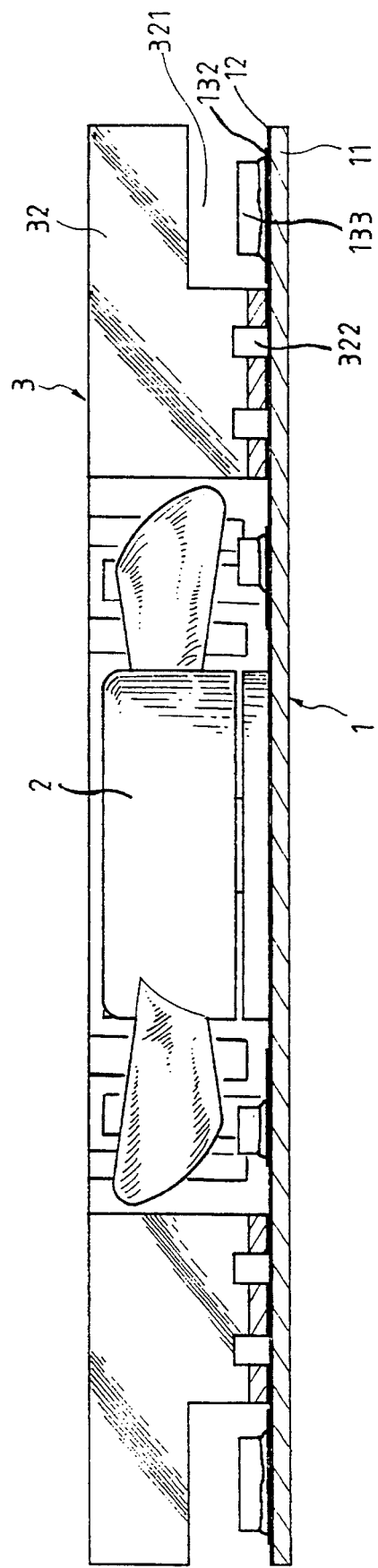
FIG. 4 shows an alternate form of the present invention.

Referring to FIG. 4, alternatively, the fan 2 can be fastened to the surface of the metal PC board 1 by an adhesive agent.

It is to be understood that the drawings are designed for purposes of illustration only, and are not intended as a definition of the limits and scope of the invention disclosed.

I claim:

1. A CPU heat dissipating apparatus comprising a PC board, a heat sink, and a fan, wherein said heat sink comprises a circular center opening, which receives said fan for monnfing on said PC board, and a plurality of radial flanges radially and alternatively spaced around said circular center opening at two different elevations; said PC board comprises a plurality of radial welding points to which the radial flanges of lower elevation are welded, and a printed circuit to which electronic components are welded.

2. The CPU heat dissipating apparatus of claim 1 wherein said heat sink comprises a plurality of holes and notches on the radial flanges which respectively receive the conductors and electronic component of said printed circuit to separate said conductors and electronic components from one another.

\* \* \* \* \*